(12) United States Patent
Grawert et al.

(10) Patent No.: US 7,812,423 B2
(45) Date of Patent: Oct. 12, 2010

(54) OPTICAL DEVICE COMPRISING CRYSTALLINE SEMICONDUCTOR LAYER AND REFLECTIVE ELEMENT

(75) Inventors: Felix Jan Grawert, Cambridge, MA (US); Shoji Akiyama, Annaka (JP); Kazumi Wada, Lexington, MA (US); Franz X. Kaertner, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 135 days.

(21) Appl. No.: 10/916,869

(22) Filed: Aug. 12, 2004

(65) Prior Publication Data
US 2005/0062038 A1    Mar. 24, 2005

Related U.S. Application Data

(60) Provisional application No. 60/494,617, filed on Aug. 12, 2003.

(51) Int. Cl.
*H01L 31/0232* (2006.01)
(52) U.S. Cl. .................... 257/436; 257/16; 257/21; 257/22
(58) Field of Classification Search ............... 257/436, 257/16, 21, 22
See application file for complete search history.

(56) References Cited

U.S. PATENT DOCUMENTS

| | | | |
|---|---|---|---|
| 5,007,059 A | 4/1991 | Keller et al. | |
| 5,237,577 A | 8/1993 | Keller et al. | |
| 5,627,854 A | 5/1997 | Knox | |
| 6,150,190 A | 11/2000 | Stankus et al. | |
| 6,466,604 B1 | 10/2002 | Kopf | |
| 2001/0032977 A1* | 10/2001 | Abe et al. | 257/15 |
| 2002/0089637 A1 | 7/2002 | Lim et al. | |
| 2002/0105000 A1 | 8/2002 | Abe | |
| 2003/0128600 A1* | 7/2003 | Noehte et al. | 365/200 |
| 2003/0197936 A1* | 10/2003 | Wang et al. | 359/487 |

FOREIGN PATENT DOCUMENTS

| | | |
|---|---|---|
| EP | 0795941 | 9/1997 |
| EP | 0805529 | 11/1997 |
| EP | 0860913 | 8/1998 |
| JP | 2001094208 | 4/2001 |
| WO | WO00/48278 | 8/2000 |

* cited by examiner

*Primary Examiner*—Long Pham
(74) *Attorney, Agent, or Firm*—Gauthier & Connors LLP

(57) ABSTRACT

An optical semiconductor includes a first semiconductor layer and at least one reflective element that is formed on the semiconductor layer. The at least one reflective element comprises alternating layers of high and low index layers. A crystalline semiconductor layer is formed on the at least one reflective element.

36 Claims, 7 Drawing Sheets

OPTICAL DEVICE COMPRISING CRYSTALLINE SEMICONDUCTOR LAYER AND REFLECTIVE ELEMENT

PRIORITY INFORMATION

This application claims priority from provisional application Ser. No. 60/494,617 filed Aug. 12, 2003, which is incorporated herein by reference in its entirety.

This invention was made with government support under Grant No. ECS-0119452 awarded by the NSF. The government has certain rights in the invention.

BACKGROUND OF THE INVENTION

The invention relates to the field of optical semiconductors, and in particular to the fabrication of optical semiconductor devices on a crystalline semiconductor layer and simultaneously on a reflective element by a simple, robust and high-yield production process.

Many optical devices are composed of a number of device layers, such as quantum wells, semiconductor junctions (e.g. pn-junctions), buffer layers, electron barriers etc., and at least one reflective element such as a backmirror. For example, many light emitting devices such as VCSELS consist of a bottom reflector, a semiconductor junction providing for light emission, and a top reflector. Other reflective optical devices consist of a reflector, on top of which a number of semiconductor layers are located that linearly or nonlinearly modify the reflected light. Examples of these elements are optical loss and phase modulators or semiconductor saturable absorbers.

One example includes optical devices having a substrate that provides for mechanical stability, heat dissipation and in some cases electrical conductivity, a reflective element underneath the device layers that reflects all or part of the incident light and can provide additional functionality such as heat and electrical conductivity, and finally the functional layers, herein referred to as device layers or epi-layers that provide the linear or nonlinear optical functionality of the device. In addition, on top of the device layers a top reflector can be deposited, which allows for the construction of Fabry-Perot type cavities such as in VCSELs.

All optical elements under discussion have in common that a crystalline substrate is necessary for deposition of the device layers, on which these layers can be grown. In addition, the surface, on which the device layers are deposited, should be of optical quality (i.e. low surface roughness, no scratches etc.) in order to avoid scattering losses in the device.

To date, most optoelectronic devices are made out of III-V semiconductors. One of the reasons for their success is that they can easily be integrated to provide for both reflective elements and device layers, and that the resulting elements can be produced in one processing step. On a semiconductor substrate such as GaAs or InP, layers out of III-V semiconductors can be grown lattice matched or slightly lattice mismatched, such that the crystalline structure, high surface quality and low defect density are preserved during the deposition process. Possible growth schemes are MBE, MOCVD or similar. In addition, a variation of the semiconductor compounds grown allows for variation of electrical and optical properties such as bandgap, Fermi level and refractive index. Thus, by deposition of a layer sequence with alternating high and low refractive index, a reflective element can be grown. Since the crystalline structure and high surface quality are preserved during the deposition process, the device layers can simply be deposited in the same growth process after deposition of the reflector.

However, one problem is that the refractive index between two layer materials that can be grown lattice matched is rather small. This problem is especially significant for devices based on InP, which can operate at the communications wavelength of 1.5 µm. A small index contrast makes it necessary to employ a large number of layers in the reflector to achieve a high reflectivity, and it leads to a narrow bandwidth and small acceptance angle of the reflector. This can lead to problems in applications, where a good electrical or thermal conductivity of the reflector is required, or where a wide bandwidth is necessary.

Numerous approaches to overcome these problems have been made in the past. First of all, III-V-based high reflectors based on material systems different from the standard GaAs and InP-based materials are under investigation. For example, a higher index material system could be InSb. Furthermore, for some of the applications discussed (semiconductor saturable absorbers and VCSELs) the reflector composed of III-V semiconductors has been replaced by dielectric or metallic reflectors. However, since the device layers must still be grown on a crystalline semiconductor film and since they cannot be grown on such a dielectric/metallic back-reflector, this requires a number of additional process steps. This adds complexity and reduces yield in the production process. One approach consists of first growing one or more etch stop layers lattice-matched on the substrate, then growing the device layers, then removing part of the substrate by etching from the back side and finally depositing of a dielectric/metallic back-reflector. However, besides the added complexity, this approach has a number of disadvantages.

The usable part of the wafer including device layers and back-reflector is small. In addition, the devices can have low mechanical stability and problems of heat dissipation since the devices are very thin, in the places where a back-reflector has been added. Finally, from the device side it is difficult to locate the functional device areas. Therefore, alternative approaches have been undertaken to add dielectric/metallic backmirrors to III-V semiconductor devices. For example, in one approach, first the device layer has been grown, then a dielectric/metallic reflector was deposited on top of it, and eventually the entire device was mounted with an adhesive on a new substrate such as quartz or copper.

These approaches are similar in that they include many steps in process technologies different from growth of the device layers, such that the devices can even have to be shipped to different production facilities for their completion. Besides the high complexity, the yield of all these processes is very low.

To overcome the problem of thick and narrowband back-mirrors or of backreflectors that cannot be integrated with existing process technology, efforts have been made recently to develop semiconductor-based high-index contrast reflectors that can be integrated with existing process technology. These reflectors typically consist of two materials with a very large refractive index, for example silicon (Si) with an index $n=3.5$ and silicon dioxide ($SiO_2$) with $n=1.45$. For simplicity this discussion will be limited to these two layer materials, but the invention is to be understood to be applicable to all possible material systems with a high index contrast. For example, the high index material could also be doped Si, Si-compounds such as $Si(x)Ge(1-x)$, Ge etc and the low index material could be $Si(x)O(y)$, SiN, ITO, and other heat or electrically conductive materials.

One method is to fabricate high-index contrast reflectors for use as back-reflectors in optical devices. According to this method, layer pairs of high- and low index are stacked on top of each other layer pair by layer pair by substrate bonding and smart-cut method to form the multilayer reflector. In this method all silicon layers are crystalline, and all surfaces can be high optical quality, such that the aforementioned problems are eliminated. However, this method does not allow for cost-effective batch processing (tens of wafers at a time). Furthermore, the repeated wafer bonding and cutting process leads to a low yield due to wafer breakage and bonding failures. Thus, this process produces the desired result at low yield and high cost.

Another method to fabricate high-index contrast reflectors is to deposit the multilayer stack comprising of low- and high index layers by vapor phase growth such as CVD. The benefit of this method is that it allows for cost-effective batch processing of a large number of wafers at a time, and that it avoids the yield-reducing wafer bonding technique. However, two problems result from this deposition method. First of all, the final surface is very rough, such that large scattering losses occur which can be detrimental to the device. It has been shown that the problem of scattering loss due to surface roughness can be overcome by flipping the multilayer stack, such that the layer deposited at the beginning of the growth appears topmost in the final device. The second problem of this method is that the semiconductor layers of the reflector are no longer crystalline, but amorphous or polycrystalline. As a result, they cannot be used as a substrate for subsequent growth of the device layers on top.

SUMMARY OF THE INVENTION

According to one aspect of the invention, there is provided an optical semiconductor. The optical semiconductor includes a first substrate layer and at least one reflective element that is formed on the first substrate layer. The at least one reflective element comprises alternating layers of high and low index layers. A crystalline semiconductor layer is formed on the at least one reflective element.

According to another aspect of the invention, there is provided a method of forming an optical semiconductor. The method includes providing a first substrate layer and forming at least one reflective element on the first substrate layer. The at least one reflective element comprises alternating layers of high and low index layers. Also, the method includes forming a crystalline semiconductor layer on the at least one reflective element.

According to another aspect of the invention, there is provided an optical saturable absorber. The optical saturable absorber includes a first substrate layer and at least one reflective element that is formed on the first substrate layer. The at least one reflective element comprises alternating layers of high and low index layers. A crystalline semiconductor layer is formed on the at least one reflective element. At least one device layer is formed on the crystalline semiconductor layer.

According to yet another aspect of the invention, there is provided a method of forming an optical semiconductor. The method includes providing a first substrate layer and forming at least one reflective element on the first substrate layer. The at least one reflective element comprises alternating layers of high and low index layers. Also, the method includes forming a crystalline semiconductor layer on the at least one reflective element. Moreover, the method includes forming at least one device layer on the crystalline semiconductor layer.

DETAILED DESCRIPTION OF THE INVENTION

The invention provides several inventive techniques to fabricate reflective optical elements being terminated with a crystalline semiconductor top layer. In addition, it provides a number of improved devices based of the resulting structure.

It is highly desirable to fabricate high-index contrast multilayer stacks (reflectors) by cost-effective and high-yield batch processes such as the vapor phase processes (e.g., CVD). To allow for fabrication of further device functionality on top of the resulting reflective element, a crystalline semiconductor layer is required to terminate the multilayer stack. According to the invention, this crystalline layer can be placed on top of the reflector in two different ways.

Figure 1A:
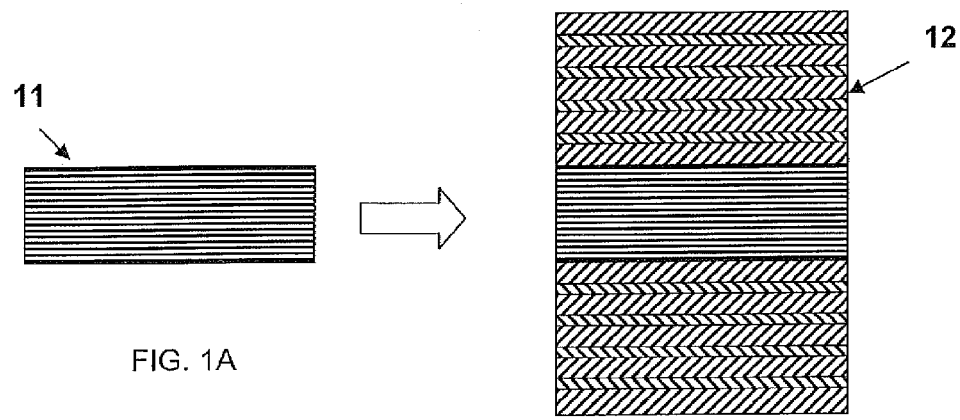
FIGS. 1A-1C are schematic diagrams illustrating how the proposed fabrication process of the invention allows to add a crystalline semiconductor layer on top of a reflector grown by CVD.
Figure 1B:
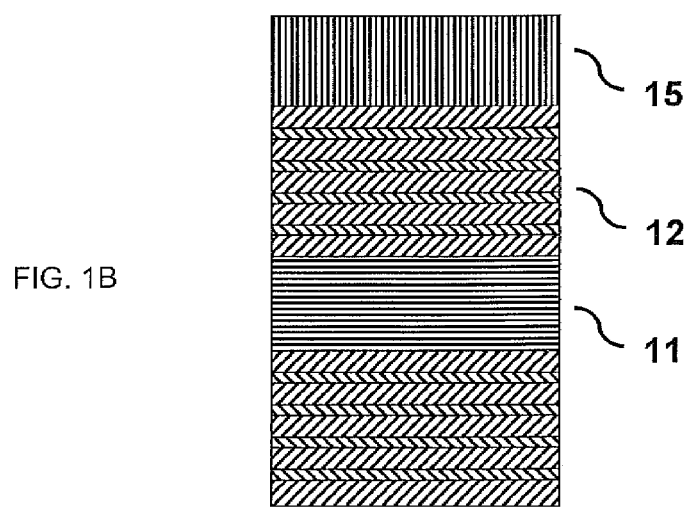
Figure 1C:
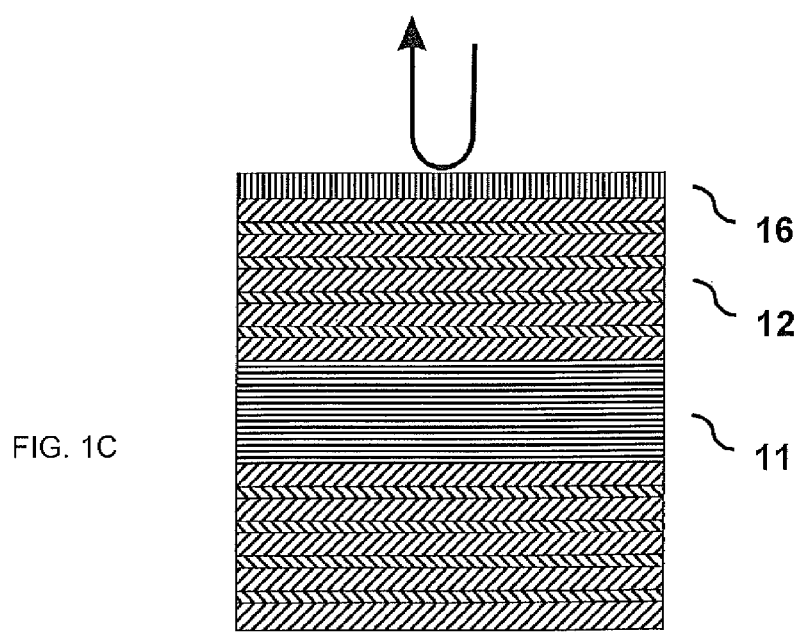

The first method relies on bonding the crystalline top layer on top of the fabricated reflector. First, the reflector is deposited by CVD on the initial substrate 11, as shown in FIG. 1A. According to the nature of the CVD process, the reflector 12 is deposited on both sides of the wafer. This has no influence on the device functionality. Then, the wafer containing the crystalline material layer 15 is bonded on top of the fabricated reflector, as shown in FIG. 1B. This wafer 15 can either be a wafer of bulk semiconductor material, such as an ordinary Si wafer, or alternatively, it can be a Silicon-On-Insulator (SOI) or another wafer comprising a crystalline silicon SiO2 multilayer structure. In the final step shown in FIG. 1C, the excess part of the bonded wafer 15 is removed such that only the crystalline semiconductor layer of desired thickness 16 remains.

In the case of a Si wafer 15, a smart cut method can be employed for this step, or alternatively, a method that allows to remove the wafer substrate material with such a precision, such that the thickness of the remaining crystalline Si layer is controlled to within the necessary precision (usually <10 nm). In the case of an SOI wafer, the handle and buried oxide of the SOI wafer can be removed be grinding and one more selective chemical etch steps. In the simplest case, this method is employed to deposit a single crystalline Si layer on top of the reflector. However, it is also possible, that prefabricated two- three or multilayer wafers are employed, such that one or more entire periods of the multilayer stack are attached on top of the CVD-grown reflector by bonding. For device functionality, a single crystalline semiconductor layer is sufficient.

Figure 2A:
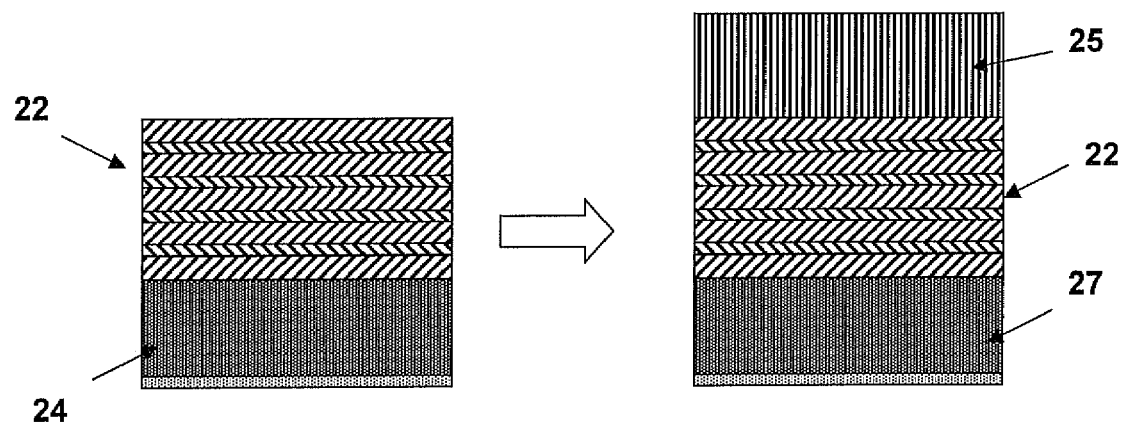
FIGS. 2A-2B are schematic diagrams illustrating how the proposed fabrication process of the invention allows to add a crystalline semiconductor layer on top of a reflector grown by CVD that has been flipped upside down.
Figure 2B:
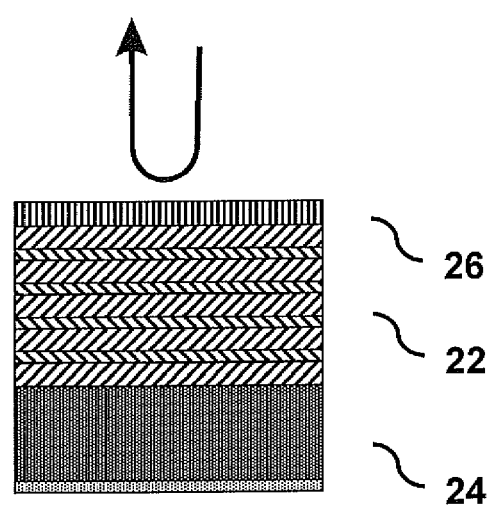

In addition to bonding the crystalline silicon layer on top of a simple CVD grown reflector, it can also be added on top of a high reflector. This is shown in FIGS. 2A-2B. The wafer containing the crystalline Si layer 25 is bonded on top of a fabricated Si/SiO2 reflector 22, as shown in FIG. 2A. Again, this wafer 25 can be an ordinary Si wafer or a SOI wafer. Then, the excess part of the bounded wafer 25 is removed as described herein such that only the crystalline Si layer of desired thickness 26 remains, as shown in FIG. 2B. Here, it is notable, that the structure depicted in FIG. 2B has been produced by two bonding steps. The substrate 24 has been added during fabrication of the high reflector 22 by bonding as well as the crystalline Si top-layer 25. To conclude, the first method includes adding a crystalline Si layer 25 on top of the existing reflector structure 22 by wafer bonding and by a suitable substrate removal process.

Figure 3A:
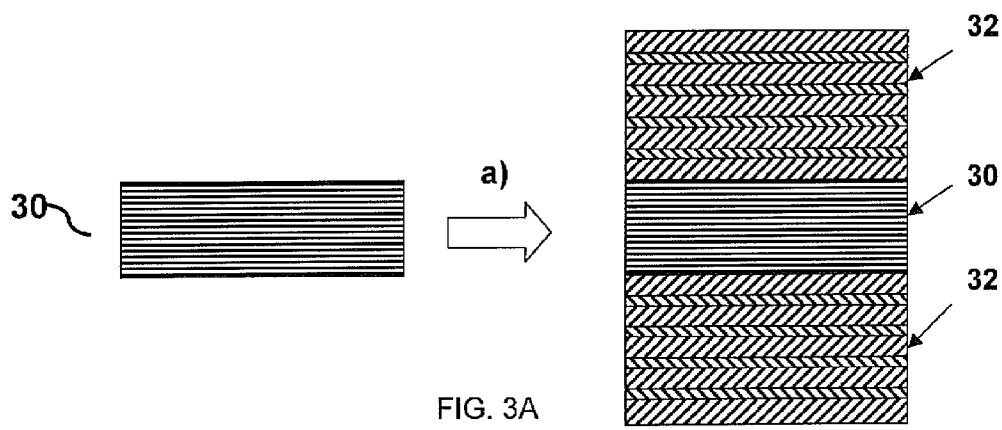
FIGS. 3A-3C are schematic diagrams illustrating how the proposed fabrication process of the invention allows to grow the reflector directly on top of the crystalline layer which is converted into the top layer of the multilayer reflector by bonding and substrate removal steps.
Figure 3B:
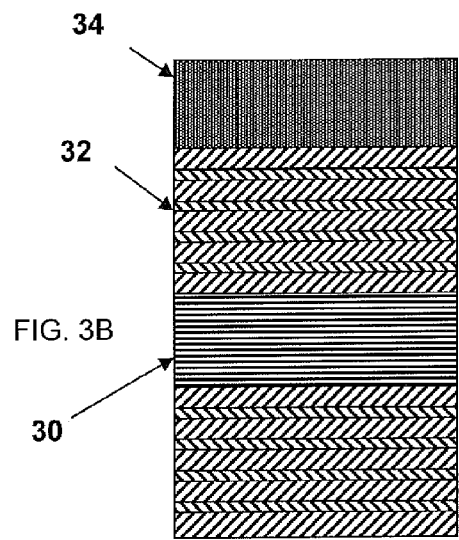
Figure 3C:
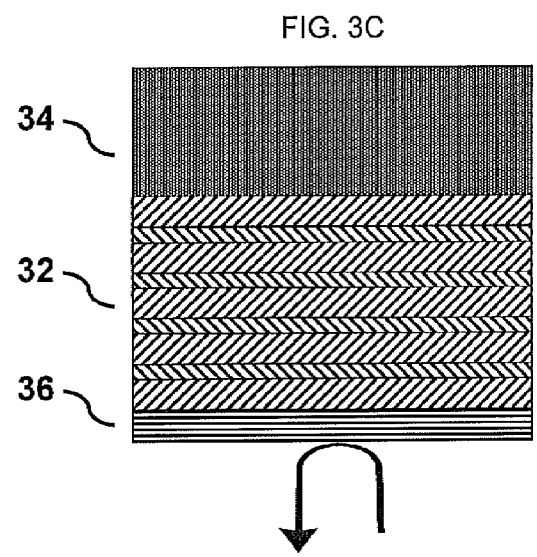

The second method for adding the crystalline semiconductor layer relies on growth of the reflector directly on top of the crystalline top layer. As shown in FIG. 3A, in the first fabrication step, the reflector 32 is grown directly on top of the wafer 30 that contains the layer that will finally serve as the crystalline top layer of the reflector. This can either be an ordinary Si wafer, or an SOI wafer or a wafer containing a prefabricated crystalline multilayer structure. Then, a new substrate, for example a Si or quartz wafer 34 is bonded on top of the reflector, as shown in FIG. 3B. Finally, the original wafer 30 is removed such that only the crystalline Si layer 36 remains, as shown in FIG. 3C. In the case of an ordinary Si wafer 34, this removal can be achieved by a smart cut process and suitable polishing step or similar process. In the case of a SOI wafer, the removal is done by grinding and selective etching.

In this case, the new, bonded wafer substrate 34 can be coated with a protective layer so as to avoid its removal in the etch process. In both cases the fabricated device consists of a substrate 34 that has been bonded on top of the reflector, the multilayer reflector 32 and the crystalline top layer 36 that serves as a substrate for subsequent device fabrication. This structure does not only provide a crystalline top layer 34, but it provides for very low scattering losses, since the topmost layers of the reflector have been grown first and thus have the best surface quality. To conclude, the second method consists of growing the reflector 32 directly on top of the crystalline semiconductor layer 34 and on one subsequent bonding and substrate removal step.

Figure 4:
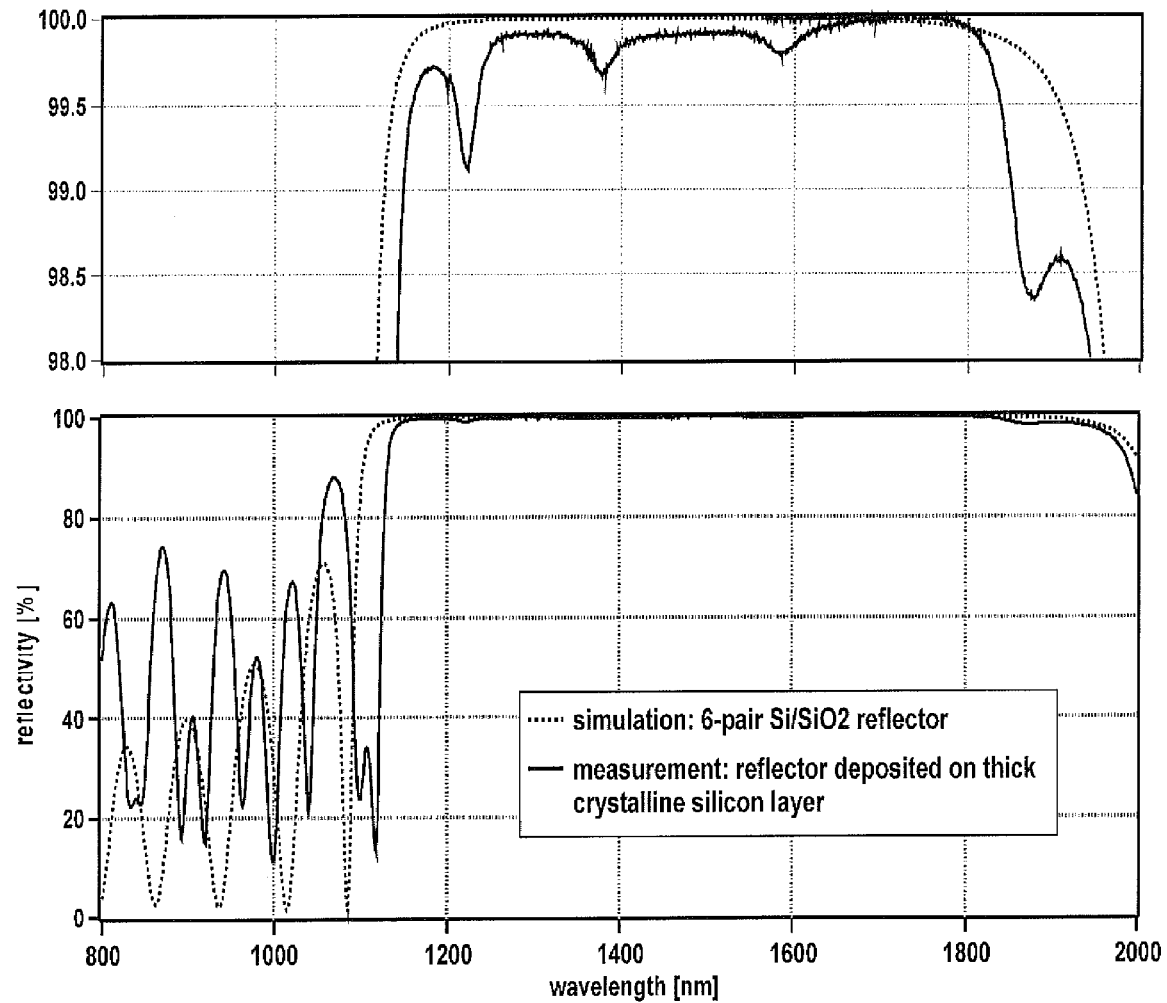
FIG. 4 is a graph illustrating the reflectivity of a six pair Si/SiO2 reflector on top of a 1.39 um thick Si film that originates from an SOI wafer according to the second fabrication method.

FIG. 4 shows the reflectivity of a six pair Si/SiO2 reflector that was grown directly on top of the crystalline Si layer. Specifically, it was grown on top of an SOI wafer, then the structure was bonded to a Si wafer, and finally the handle and buried oxide of the SOI wafer were removed by grinding and selective etch. The resulting device has a crystalline top layer, which can be used for growth of further device functionality. Its measured reflectivity approaches the simulated reflectivity to 0.2% except for the dips in reflectivity, which results from the Fabry-Perot resonances of the reflections from front- and back-faces of the thick crystalline Si-film. This interferometer has not been taken into account in the simulation.

Besides the benefit of forming a substrate for subsequent device layer growth, the crystalline semiconductor layer can even enhance the reflectivity of the reflector. The stop band of the reflector can be chosen to reflect wavelengths, which are close to the absorption edge of the high index semiconductor employed. For example, a Si/SiO2 based reflector can be operated at wavelengths close to the absorption edge of silicon at 1100 nm. In case of amorphous or polycrystalline material the absorption edge is smeared out such that the high index layers have a significant loss. If instead a crystalline top layer is employed, the losses at wavelengths just above the bandgap significantly lower than in the polycrystalline case.

Semiconductor saturable absorbers are nonlinear reflective devices that consist of a linear reflector and a semiconductor structure that shows saturable absorption: from light that is incident at a low fluence, a certain fraction is absorbed. The higher the fluence of the incident radiation, the smaller this absorbed fraction becomes. Semiconductor saturable absorbers, that are also called saturable Bragg reflectors (SBRs) or SEmiconductor SAturable absorber Mirrors (SESAMs) are well known in the art, and have various design variations.

One problem that has not been solved to date regarding SBR is that the device layers, which form the nonlinearity of the SBR need to be grown on a crystalline layer located on top of or within a reflector. In addition, SBRs need a reflector with very high reflectivity and large bandwidth, since they act as mode locking devices in lasers that generate a broad optical spectrum. As mentioned herein for the general case, to date it has not been possible to place such a crystalline semiconductor film by standard fabrication methods on top of a broadband high reflector such as a high-index contrast mirror.

This problem can be alleviated with the present invention. High-index contrast mirrors with a crystalline silicon top layer fabricated according to this invention can be used as substrates for deposition of the device layers of the SBR. For example, on top of the crystalline silicon film of these intermediate devices, a Ge or SiGe absorber layer can be deposited. Either bulk material such as Ge or the like or a compound semiconductor can be employed for this layer. Alternatively, a layer made out of a graded compound semiconductor such as SiGe or the like of varying composition can be employed for the absorber layer. The bandgap for this layer or layer structure is chosen according to the criteria described herein. According to the state of the art in the structure of SBRs the absorber layer can be composed out of one or more layers of bulk material or alternatively of one or more quantum wells.

According to the state of the art, the absorber layer or the absorber structure can be covered by one or more additional layers that can act as protective layers or as top reflectors to modify the electric field distribution within the device or to provide for a certain dispersion characteristic. Furthermore, the layer structure of the semiconductor saturable absorber can be designed as to reduce or enhance the saturation fluence and to place the absorber layer in different positions of the electric field. If top layers are to be deposited on top of the absorber layer, either the same or different high-index materials can be employed that are used to form the back-reflector.

Alternatively, the composition and material properties of the suggested embodiment of the SBR allow employing a dielectric top coating. All fabrication steps described herein are large-scale batch processes that allow for cost effective high yield production of the SBR. The use of a broadband high reflector as reflective device in the SBR allows producing SBRs of bandwidth that has not been achievable to date. For example, standard semiconductor back reflectors allowed for a reflectivity of several tens of nanometers of optical bandwidth. In contrast, the Si/SiO2 back-reflector depicted in FIG. 4 achieves a reflectivity exceeding 99% over 700 nm.

However, the present invention does not only allow one to extend the bandwidth of the SBR and to simplify its fabrication, it also allows to easily integrate further functionality in the semiconductor saturable absorber that enhances the usability in the laser.

First of all, a reflective device can be constructed to generate a certain optical dispersion. This can be achieved by structures well known in the art, such as Gire-Tournois-Interferometers or more elaborate layer structures.

Figure 5:
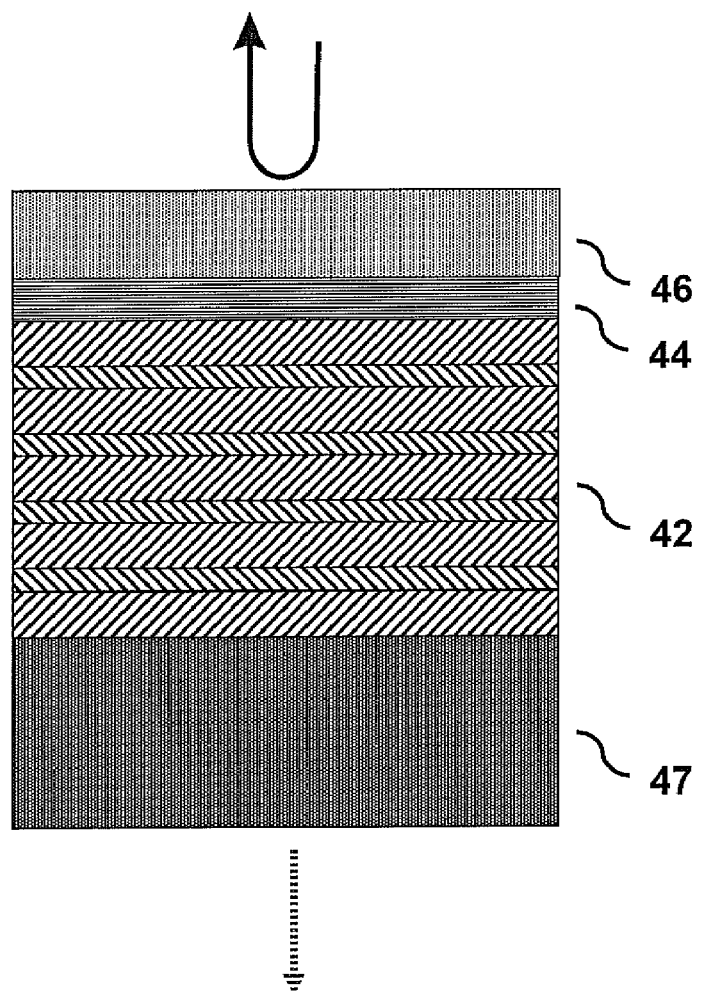
FIG. 5 is a schematic diagram illustrating a semiconductor saturable absorber fabricated according to the invention.

Second, the invention allows adding the functionality of an output coupler to the semiconductor saturable absorber. As shown in FIG. 5, in the final device the substrate 47 can be made out of any suitable material that can easily be bonded on top of the original layer stack 42. Moreover, the device includes device layers or epi-layers 46 and a crystalline Si layer 44. Thus, a material that is transparent for the laser wavelength that is simultaneously heat conductive can be chosen.

Examples of this material are quartz, sapphire, silicon nitride, SiC, GaN, BeO, BP, AlN, AlP or the like. If the reflective element of the SBR is designed to be partially transmissive (e.g., with an optical transmissivity of about 0.1% . . . 10%) a fraction of the light incident on the semiconductor saturable absorber can pass and can leave the laser cavity in which the optical element is placed. This significantly enhances the usability of the semiconductor saturable absorber device in compact laser cavities, which have only one flat end mirror, or in microchip lasers. In all other laser cavities this means that with a semiconductor saturable absorber in the laser it is still possible to have two output beams from flat end reflectors instead of one.

The present invention also allows for an easy integration of the functionality of an optically controlled loss or phase modulator or a nonlinear Fabry-Perot modulator in the laser cavity. The crystalline Si layer underneath the saturable absorber layer can be illuminated with laser light of a wavelength shorter than the bandgap of Si, such that it is absorbed and the optical properties of the silicon film are modified. For example, the absorption of light at the laser wavelength can be changed, or a change of refractive index in this layer can be exploited. Examples of this effect can be the detuning of a Fabry-Perot like cavity.

This sort of loss modulator can be employed for any desired interaction of outside electronics with the laser, such as in active mode locking, for feedback stabilization, for noise reduction, for wavelength tuning or for other effects in a laser. In general, one can conclude that a bulk semiconductor layer or a resonant structure can be incorporated in the semiconductor saturable absorber whose properties can be modified by illumination with laser light of a different wavelength. If the bonded substrate 47 of the semiconductor saturable absorber is chosen to be transparent for this wavelength, this illumination can be incident from the backface of the device.

Examples of a suitable material for the back-substrate are quartz, sapphire, silicon nitride, SiC, GaN, BeO, BP, AlN, AlP or the like. This principle of backside illumination allows employing a large number of different wavelength for the incident radiation, since the incident light is delivered directly to the layer whose properties it is supposed to modify. This principle can be especially beneficial in microchip lasers, where the front side of the semiconductor saturable absorber device is only accessible by light that passes the laser gain medium unless the laser gain medium is transparent for this light.

Figure 6A:
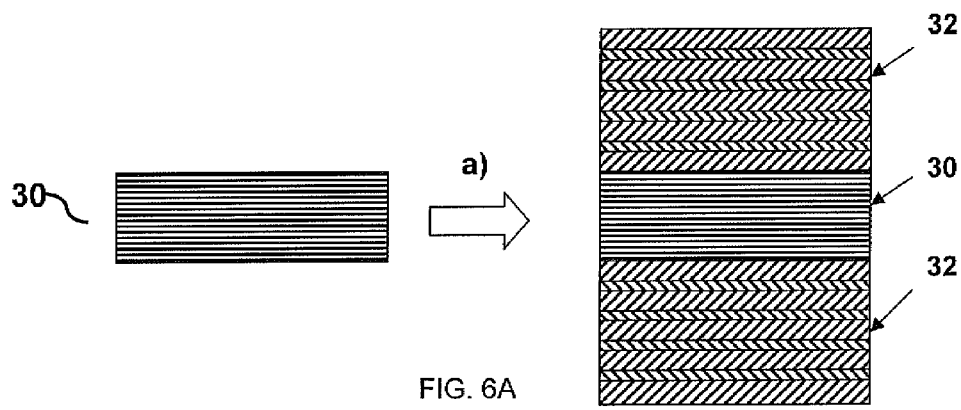
FIGS. 6A-6E are schematic diagrams illustrating the fabrication process that allows attach bonded III-V semiconductor devices on top of the high-index contrast reflector.
Figure 6B:
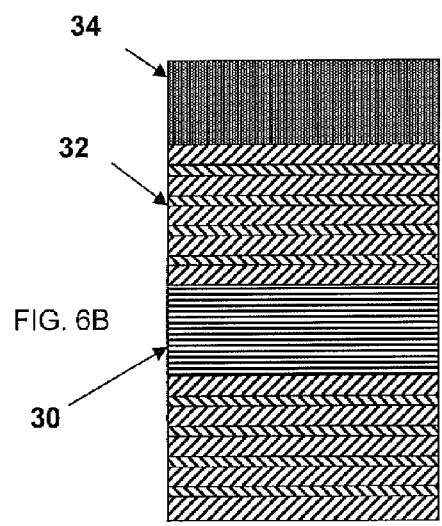
Figure 6C:
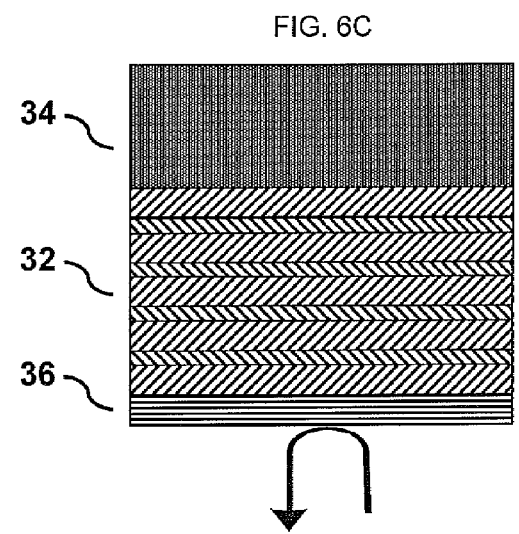
Figure 6D:
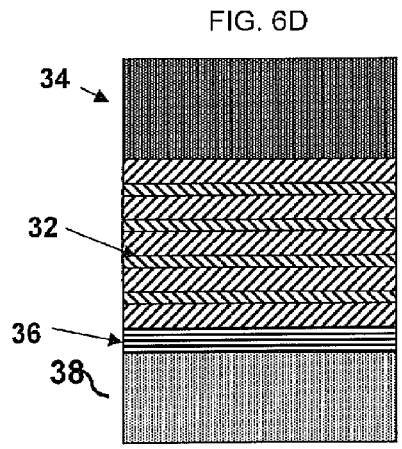
Figure 6E:
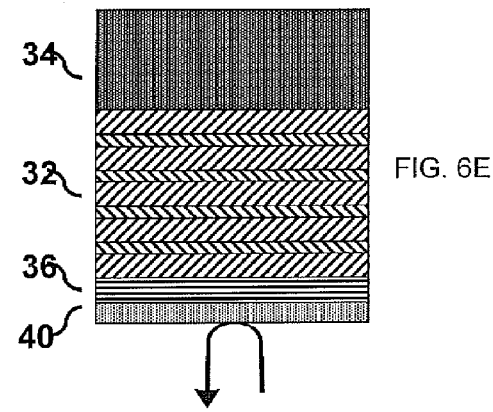

The present invention allows for the use of different material systems for backmirror and device layers. Namely, it permits to add III-V semiconductor based device structures on top of the high-index contrast reflector by wafer bonding. A possible fabrication process is shown in FIGS. 6A-6E. First of all, the backreflector with a crystalline silicon top layer is fabricated as shown in FIGS. 6A-6C according to the aforementioned technique shown in FIGS. 3A-3C. Afterwards, the III-V semiconductor wafer 38 is bonded on top of the crystalline semiconductor layer, as shown in FIG. 6D.

For this bonding process to be possible, a high-quality surface must be available, such as it is provided by the crystalline Silicon layer. This III-V semiconductor wafer 38 is bonded on the existing device such that its device layers 40 are pointing toward the reflective element 32. In the final step shown in FIG. 7E, the substrate of a portion of the III-V semiconductor wafer 38 is removed to form the device layer 40. This can be achieved by grinding, lapping and a selective etch. Thus, for the etching to be effective, underneath the device layers 40 one or more etch stop layers can be needed to allow for selective substrate removal. In the final device, one or more III-V semiconductor based device layers 40 are placed on top of the high-index contrast reflective element 32.

In this embodiment of the present invention, all the additional functionality can be integrated that has been described herein. Namely, the reflective element 32 together with the III-V semiconductor layers 40 can create a certain dispersion, the reflector 32 and substrate 30 can allow for output coupling functionality, and the crystalline silicon layer together with the III-V semiconductor based device layers 40 can be used as a loss modulator. This loss modulator can again be optically excited from either front side or through a transparent substrate from the backside.

Besides adding III-V semiconductor based device layers 40 by wafer bonding, the crystalline top layer of the reflector allows to deposit these layers by heteroepitaxy. This emerging technology will become widely available over the next decade.

Note the possible fabrication of a semiconductor saturable absorber on top of the novel high reflector can provide additional functionality that could be integrated. Examples for this additional functionality are elements creating dispersion, output couplers and elements whose properties are optically modified from the backside of the device through a transparent substrate. This functionality might also be exploited in devices containing only this functionality, or it might be integrated as additional functionality in other reflective optical devices.

Examples of such devices are loss or phase modulators that exploit a change in refractive index in the crystalline silicon layer. It is possible to enhance their functionality to form more sophisticated devices based on one or more crystalline semiconductor layers, such as single or multiple cavity Fabry-Perot resonators. These devices can entail one or more additional top reflectors, that might be fabricated with the same high index materials as the backmirror, or that might consist of other dielectric coatings.

The aforementioned functionality of the high-index contrast reflective element can be combined with arbitrary functionality in the device layers on top. This can be achieved by growing crystalline semiconductor structures on top of the silicon top layer. These structures could be composed of group IV bulk or compound semiconductors, or of III-V semiconductor based structures that are either grown by heteroepitaxy or attached to the top layer by wafer bonding as illustrated for the example of a semiconductor saturable absorber. In general, the attachment of III-V semiconductor based structures allows excess to the entire class of quantum well optical devices. Examples of reflective devices that can be fabricated with the present invention are loss and phase modulator of all kinds, especially electrically controlled ones, tunable filters, and topical detectors that employ the high reflector to enhance their efficiency.

Moreover, the backmirror can be made out of electrically conductive materials. In this case, the bottom contact for the semiconductor device deposited on top of the reflector can be made through multilayer reflector.

The fabrication of light emitting devices on top of high-index contrast reflectors that are completely fabricated by wafer bonding has been claimed. This method allows creating a high reflective multilayer stack terminated with a crystalline semiconductor layer. However, this fabrication method is slow and expensive because of its low yield. The present invention allows for a much faster, cheaper production of highly reflecting substrates for light emitting devices at a high yield. The inventive fabrication process produces a crystalline semiconductor layer on top of a high reflector by batch processes such as CVD, and allows for the same optical functionality in terms of top layers to be integrated.

Namely, on top of this crystalline semiconductor film light emitting devices can be deposited based on group IV semiconductors, based on doped group IV semiconductors, such Erbium doped group IV semiconductors, or based on heteroepitaxially grown or bonded III-V semiconductors. Examples for this class or devices are lasers, light emitting diodes, VCSELs and optical devices for chip-to-chip interconnects.

Also in this class of devices the high index contrast reflector can be used to integrate functionality that exceeds that of an ordinary back reflector. First of all, the high reflector can be made electrically conductive. Second, if a number of boundary conditions are fulfilled the reflector can be made omnidirectional, such that is reflects light incident from all angles at all polarizations. This can be especially useful for light emitting diodes. Third, the reflector and the substrate can be chosen partially transparent such that a small fraction of the light generated in the light emitting device leaves the device at its back face. This light might be used for monitor purposes in electrical or optical integrated circuits.

The invention allows for a cost-effective fabrication of similar waveguide structures and optical integrated circuit substrates. Both fabrication processes mentioned depicted in FIGS. 2A-2C and 3A-3C lead to the formation of such an optical substrate comprising of a crystalline layer out of which the waveguide can be formed and a reflective multilayer stack. The crystallinity of the waveguide layer is important in order to minimize optical loss during propagation, which the multilayer reflector can be of polycrystalline and dielectric material as long as the surfaces closest to the waveguide layer are of low surface roughness.

Figure 7A:
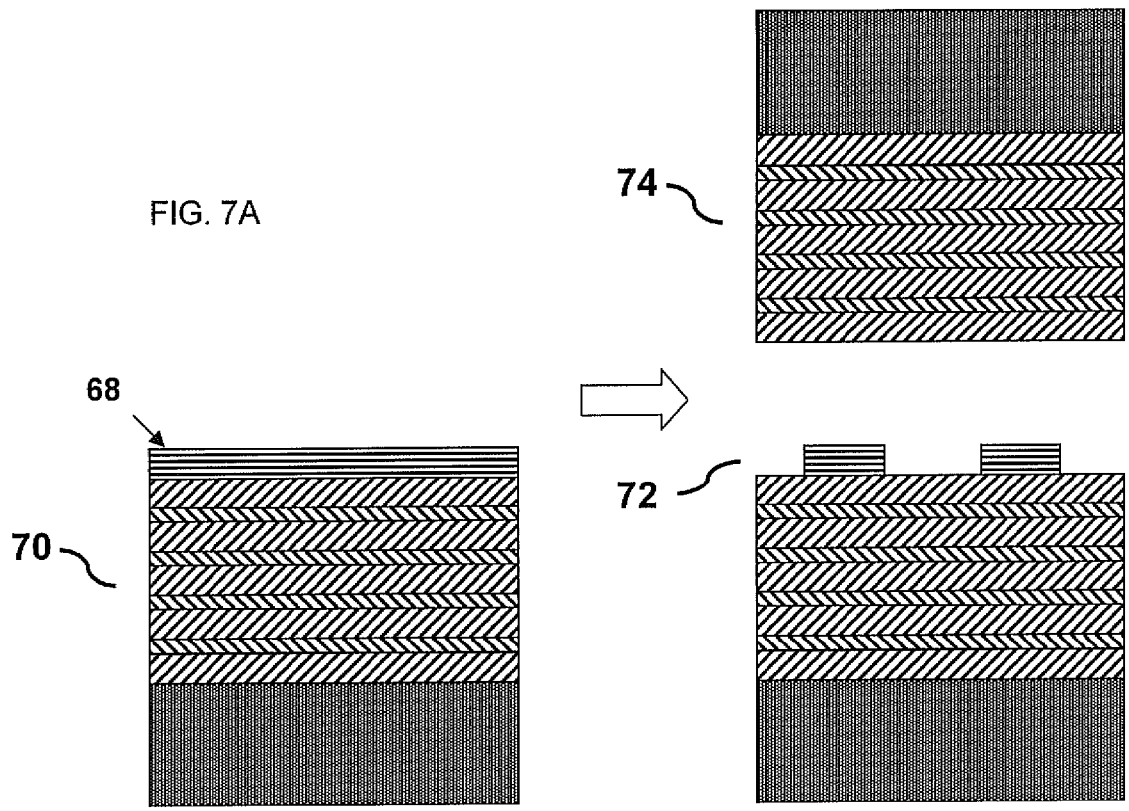
FIGS. 7A-7B are schematic diagrams illustrating the process that allows for fabrication of optical waveguides and substrates with the invention.
Figure 7B:
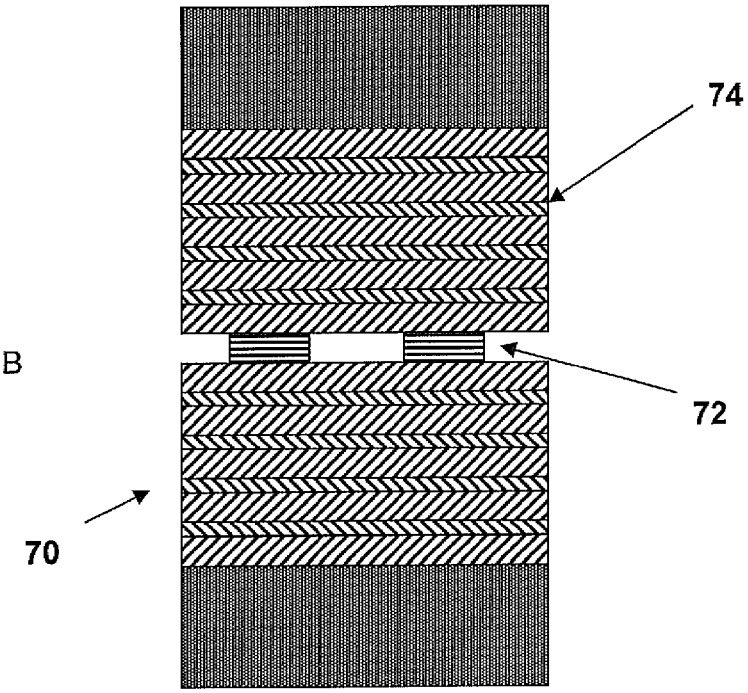

For the fabrication of such an optical substrate, a reflector 70 with crystalline top layer 68 according to the invention is taken, and the crystalline top layer 68 is patterned with standard processing techniques, as shown in FIG. 7A, to form the optical waveguide and device layer 72. Then, another high-index contrast reflector 74 is attached on top of this layer 72 to provide for vertical waveguiding. This reflector 74 can be fabricated cost effectively, as shown in FIG. 7B. Again, additional functionality can be integrated in the reflectors and substrates.

First of all, they can be chosen to be electrically conductive as to allow for electrical contacts to the devices in the device layer. Second, the reflectors and substrates can be chosen to be partially transmissive such that some light can leave the device layer in order to be used for monitor purposes. In addition, the reflectors and substrates can be chosen to be transmissive for a wavelength different from that guided in the waveguides to allow for an interaction of external devices with the devices in the waveguide layer. One such application might be the detuning of microring resonators, optical filters, interferometers or the like with incident radiation. Another application might be to monitor the state of the devices in the waveguide layer with light being send through the entire waver structure perpendicular to the multilayer structure.

Although the present invention has been shown and described with respect to several preferred embodiments thereof, various changes, omissions and additions to the form and detail thereof, can be made therein, without departing from the spirit and scope of the invention.

What is claimed is:

1. An optical semiconductor structure comprising:
   a first substrate layer;
   at least one first reflective element that is formed on the top or bottom side of said first substrate layer, said at least one reflective element comprising high and low index layers, said high index layers comprise amorphous or polycrystalline materials and said low index layers comprise insulating or amorphous materials formed using chemical vapor deposition;
   a crystalline semiconductor layer that is formed on said at least one first reflective element;
   a second reflective element coupled to said one or more patterned device layers, said second reflective element comprising high and low index layers, said high index layers comprise amorphous or polycrystalline materials and said low index layers comprise insulating or amorphous materials formed using chemical vapor deposition.

2. The optical semiconductor structure of claim 1, wherein said first substrate layer comprises a Si wafer.

3. The optical semiconductor structure of claim 1, wherein said high index layer comprises Si, doped Si, Si-compounds, Ge, or and other heat or electrically conductive materials.

4. The optical semiconductor structure of claim 1, wherein said low index layer comprises $SiO_2$, $Si(x)O(y)$, SiN, ITO, or other heat or electrically conductive materials.

5. The optical semiconductor structure of claim 1, wherein said crystalline semiconductor layer comprises a Si wafer.

6. The optical semiconductor structure of claim 1, where the at least one reflective element is electrically conductive.

7. The optical semiconductor structure of claim 1, where the at least one first reflective element is thermally conductive.

8. The optical semiconductor structure of claim 1, where the at least one first reflective element is omnidirectional.

9. The optical semiconductor structure of claim 1, where the at least one first reflective element is partially transparent.

10. The optical semiconductor structure of claim 1, wherein said crystalline semiconductor layer comprises a Silicon-On-Insulator (SOI) or another wafer comprising of a crystalline silicon $SiO_2$ multilayer structure.

11. The optical semiconductor structure of claim 1, wherein said one or more device layers comprise a III-V semiconductor or a group IV semiconductor.

12. An optical saturable absorber comprising:
    a first substrate layer;
    at least one first reflective element that is formed on the top or bottom sides of said first substrate layer, said at least one first reflective element comprising high and low index layers, said high index layers comprise of amorphous or polycrystalline materials and said low index layers comprise insulating or amorphous materials formed using chemical vapor deposition;

a crystalline semiconductor layer that is formed on said at least one first reflective element;

one or more patterned device layers that are formed on said on said crystalline semiconductor layer such as to allow the fabrication of one or more optical structures; and a second reflective element coupled to said one or more patterned device layers, said second reflective element comprising high and low index layers, said high index layers comprise amorphous or polycrystalline materials and said low index layers comprise insulating or amorphous materials formed using chemical vapor deposition.

13. The optical saturable absorber of claim 12, wherein said first substrate layer comprises a Si wafer.

14. The optical saturable absorber of claim 12, wherein said high index layer comprises Si, doped Si, Si-compounds, Ge, or and other heat or electrically conductive materials.

15. The optical saturable absorber of claim 12, wherein said low index layer comprises SiO2, Si(x)O(y), SiN, ITO, or other heat or electrically conductive materials.

16. The optical saturable absorber of claim 12, wherein said crystalline semiconductor layer comprises a Si wafer.

17. The optical saturable absorber of claim 12, where the at least one first reflective element is electrically conductive.

18. The optical saturable absorber of claim 12, where the at least one first reflective element is thermally conductive.

19. The optical saturable absorber of claim 12, where the at least one first reflective element is omnidirectional.

20. The optical saturable absorber of claim 12, where the at least one first reflective element is partially transparent.

21. The optical saturable absorber of claim 12, wherein said crystalline semiconductor comprises a Silicon-On-Insulator (SOI) or another wafer comprising of a crystalline silicon SiO2 multilayer structure.

22. The optical saturable absorber of claim 12, wherein said one or more device layers comprise a III-V semiconductor or a group IV semiconductor.

23. The optical saturable absorber of claim 12, wherein said absorber is configured to be an output coupler.

24. The optical saturable absorber of claim 23, wherein the output coupler comprises Quartz, Sapphire, Silicon Nitride, SiC, GaN, BeO, BP, MN, AlP or the like.

25. The optical saturable absorber of claim 12, wherein said absorber is configured to provide optical dispersion.

26. The optical semiconductor structure of claim 1, wherein said structure is configured to be a loss, phase modulator, or a nonlinear Fabry-Perot modulator.

27. The optical semiconductor structure of claim 26, wherein the loss, phase modulator, or the nonlinear Fabry-Perot modulator is optically controlled.

28. The optical saturable absorber of claim 26, wherein the loss, phase modulator, or the nonlinear Fabry-Perot modulator is electrically controlled.

29. The optical saturable absorber of claim 26, wherein the loss, phase modulator, or the nonlinear Fabry-Perot modulator is thermally controlled.

30. The optical semiconductor structure of claim 1, wherein the structure is configured to be a tunable filter.

31. The optical semiconductor structure of claim 1, wherein the structure is configured to be an optical detector.

32. The optical semiconductor structure of claim 1, wherein the structure is configured to be a light emitting device.

33. The optical semiconductor structure of claim 1, wherein the structure is configured to be part of an optical waveguide.

34. The optical semiconductor structure of claim 1, wherein the structure is configured to be part of an optical integrated circuit substrate.

35. The optical semiconductor structure of claim 1, wherein the crystalline semiconductor layer is covered by on or more additional layers to modify the electric field distribution in the structure or to optical properties.

36. The optical semiconductor structure of claim 1, wherein the crystalline semiconductor layer is covered by on or more additional layers to modify the electric field distribution in the structure or to optical properties.

* * * * *